(12) United States Patent
Murata

(10) Patent No.: US 9,832,408 B2
(45) Date of Patent: Nov. 28, 2017

(54) IMAGING SENSOR AND IMAGING DEVICE WITH COLUMN ADC

(71) Applicant: NIKON CORPORATION, Tokyo (JP)

(72) Inventor: Hironobu Murata, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/560,710

(22) Filed: Dec. 4, 2014

(65) Prior Publication Data

US 2015/0163441 A1   Jun. 11, 2015

Related U.S. Application Data

(63) Continuation-in-part of application No. PCT/JP2013/003533, filed on Jun. 5, 2013.

(30) Foreign Application Priority Data

Jun. 8, 2012   (JP) ................................. 2012-131232

(51) Int. Cl.
| | | |
|---|---|---|
| *H04N 5/335* | (2011.01) | |
| *H04N 5/3745* | (2011.01) | |
| *H04N 5/378* | (2011.01) | |
| *H01L 27/146* | (2006.01) | |
| *H04N 5/369* | (2011.01) | |

(52) U.S. Cl.
CPC ..... *H04N 5/37455* (2013.01); *H01L 27/1464* (2013.01); *H04N 5/369* (2013.01); *H04N 5/378* (2013.01); *H04N 5/3745* (2013.01)

(58) Field of Classification Search
CPC ......... H04N 5/335; H04N 5/374; H04N 5/378
See application file for complete search history.

(56) References Cited

U.S. PATENT DOCUMENTS

| | | | | |
|---|---|---|---|---|
| 8,730,081 B2* | 5/2014 | Yang | ...................... | H04N 5/378 250/208.1 |
| 2010/0245647 A1* | 9/2010 | Honda | .............. | H01L 27/14634 348/308 |

(Continued)

FOREIGN PATENT DOCUMENTS

| | | |
|---|---|---|
| CN | 101228631 A | 7/2008 |
| CN | 101848344 A | 9/2010 |
| JP | 2011-071958 A | 4/2011 |
| JP | 2011-151375 A | 8/2011 |
| JP | 2012-054876 A | 3/2012 |
| JP | 2012-104684 A | 5/2012 |

OTHER PUBLICATIONS

JP 2010-251980 english translation.*

(Continued)

*Primary Examiner* — Lin Ye
*Assistant Examiner* — John H Morehead, III
(74) *Attorney, Agent, or Firm* — Oliff PLC

(57) ABSTRACT

An imaging sensor comprising: an imaging chip in which a plurality of pixel are arranged in a matrix; and a signal processing chip that is each provided for one or more pixel columns or one or more pixel rows, has a device that performs signal processing on a pixel signal output from a pixel, and is stacked with the imaging chip is provided. For example, the device that performs signal processing is an A/D converter that converts a pixel signal output from the pixel into a digital signal, and when a pixel signal output from the pixel is converted into a digital signal, at least two or more A/D converters among the A/D converters are controlled in parallel.

10 Claims, 13 Drawing Sheets

(56) References Cited

U.S. PATENT DOCUMENTS

| | | | |
|---|---|---|---|
| 2010/0259662 A1* | 10/2010 | Oike | H04N 5/335 348/308 |
| 2010/0271523 A1* | 10/2010 | Hara | H04N 5/367 348/302 |
| 2010/0276572 A1* | 11/2010 | Iwabuchi | H04N 5/2253 250/208.1 |
| 2011/0050969 A1 | 3/2011 | Nishihara | |
| 2011/0157445 A1 | 6/2011 | Itonaga et al. | |
| 2012/0057056 A1* | 3/2012 | Oike | H01L 27/14634 348/294 |
| 2012/0120293 A1* | 5/2012 | Mabuchi | H01L 27/14632 348/302 |
| 2012/0153419 A1 | 6/2012 | Itonaga et al. | |
| 2013/0342745 A1* | 12/2013 | Suenobu | H01L 27/14618 348/300 |
| 2014/0175592 A1 | 6/2014 | Iwabuchi et al. | |

OTHER PUBLICATIONS

Aug. 27, 2013 International Search Report issued in Application No. PCT/JP2013/003533.

Kiyoyama et al., "A Very Low Area ADC for 3-D Stacked CMOS Image Processing System", IEEE, pp. 1-4, 2012.

Aug. 27, 2013 International Preliminary Report on Patentability issued in Application No. PCT/JP2013/003533.

Dec. 3, 2015 Extended European Search Report issued in European Patent Application No. 13800653.1.

Feb. 16, 2017 Office Action issued in European Patent Application No. 13800653.1.

Mar. 20, 2017 Office Action issued in Chinese Patent Application No. 201380029815.6.

Jul. 11, 2017 Office Action issued in Japanese Patent Application No. 2014-519841.

\* cited by examiner

IMAGING SENSOR AND IMAGING DEVICE WITH COLUMN ADC

The contents of the following Japanese patent applications are incorporated herein by reference:
2012-131232 filed in JP on Jun. 8, 2012; and
PCT/JP2013/003533 filed on Jun. 5, 2013.

BACKGROUND

1. Technical Field

The present invention relates to an imaging sensor and an imaging device.

2. Related Art

Conventionally, an imaging sensor including a column-parallel A/D converter (simply referred to as an ADC) has been known. Also, a block-parallel ADC has been proposed for an imaging sensor in which signal processing chip is stacked (please see for example Non-Patent Document 1).
Non-Patent Document 1: "A Very Low Area ADC for 3-D Stacked CMOS Image Processing System" K. Kiyoyama et al., IEEE 3DIC 2012.

The column-parallel ADC is provided for each pixel column, and each reads out a pixel signal of each pixel in a selected row in parallel. However, because a conventional column-parallel ADC is formed on the same plane with an effective pixel area (for example, above and below in the column direction of the effective pixel area), the area of the imaging sensor increases. Also, when a plurality of rows are subjected to parallel/high speed processing, interconnections have to be routed in the effective pixel area. Also, when the plurality of rows are subjected to parallel/high speed processing, the size of an ADC becomes large, and the area of the imaging sensor further increases.

On the other hand, a block-parallel ADC is provided for each block of effective pixels (for example, for each block of ten pixels×ten pixels). However, in order to read out each pixel in a block with a single ADC, devices such as to use a complicated control line or to arrange, on an imaging chip side, a transistor for control become necessary. Also, an ADC for each block respectively operates independently. For this reason, an ADC generates heat independently, and a signal processing chip may generate heat locally. Local heat generation in a signal processing chip is transmitted to a stacked imaging chip, and can influence operation of the imaging chip.

SUMMARY

Therefore, it is an object of an aspect of the innovations herein to provide an imaging sensor and an imaging device, which are capable of overcoming the above drawbacks accompanying the related art. The above and other objects can be achieved by combinations described in the claims. That is, a first aspect of the present invention provides an imaging sensor comprising: an imaging chip in which a plurality of pixel are arranged in a matrix; and a signal processing chip that is each provided for one or more pixel columns or one or more pixel rows, has a device that performs signal processing on a pixel signal output from a pixel, and is stacked with the imaging chip.

A second aspect of the present invention provides an imaging sensor comprising: a pixel unit that has a plurality of areas that each include a plurality of pixels; a readout unit that is provided for each of the areas, and reads out signals from pixels of the area in the unit of the area; and a signal processing unit that is stacked with the pixel unit and has a first signal processing circuit that performs signal processing on a signal from a first pixel of the area that is read out by the readout unit, and a second signal processing circuit that performs signal processing on a signal from a second pixel in the area that is read out by the readout unit.

A third aspect of the present invention provides an imaging device comprising the imaging sensor.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
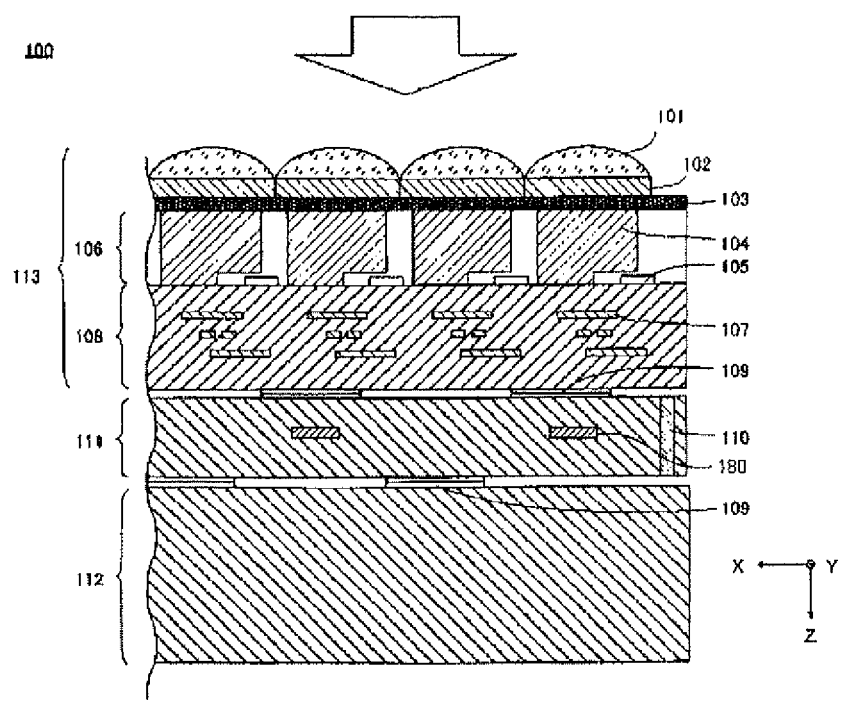
FIG. 1 is a sectional view of an imaging sensor 100 according to the present embodiment.

FIG. 1 is a sectional view of an imaging sensor 100 according to the present embodiment. Although in the present example, a so-called backside illuminating type imaging sensor 100 is illustrated, the imaging sensor 100 is not limited to a backside illuminating type, but may be a frontside illuminating type. The imaging sensor 100 only has to have a structure including a stacked chip stacked with an imaging chip 113.

The imaging sensor 100 in the present example includes the imaging chip 113 that outputs a pixel signal corresponding to incident light, a signal processing chip 111 that processes a pixel signal and a memory chip 112 that stores a pixel signal. These imaging chip 113, signal processing chip 111 and memory chip 112 are stacked, and are connected electrically with each other via a plurality of conductive bumps 109 that are Cu and the like. In the present example, the signal processing chip 111 and the memory chip 112 correspond to the above-mentioned stacked chips.

Note that, as illustrated, incident light is incident toward the Z-axis positive direction that is illustrated with an outlined arrow. In the present embodiment, the surface of the imaging chip 113 on which incident light is incident is called the backside. Also, as indicated with coordinate axes, the rightward direction on the sheet that is orthogonal to the Z-axis is defined as the X-axis positive direction, and the front side direction on the sheet that is orthogonal to the Z-axis and the X-axis is defined as the Y-axis positive direction. In some of the following figures, the coordinate axes are indicated such that the orientation of the respective figures can be known based on the coordinate axes of FIG. 1.

One example of the imaging chip 113 is a backside illuminating type MOS imaging sensor. A PD layer 106 is disposed on the backside of an interconnection layer 108. The PD layer 106 has a plurality of photoelectric converting units that generate electrical charges according to light. The imaging chip 113 outputs pixel signals according to the electrical charges. The PD layer 106 in the present example has a plurality of PDs (photodiodes) 104 disposed two-dimensionally and transistors 105 that are provided corresponding to the PDs 104. The PDs 104 are one example of the photoelectric converting units.

Color filters 102 are provided, via a passivation film 103, on the incident light incidence side of the PD layer 106. There is a plurality of types of the color filters 102 that allow passage of mutually different wavelength ranges, and the color filters 102 are particularly arrayed corresponding to each of the PDs 104. The arrays of the color filters 102 are described below. A set of the color filter 102, the PD 104, and the transistor 105 forms a single pixel.

A microlens 101 is provided on the incident light incidence side of the color filter 102 in correspondence with each pixel. The microlens 101 condenses incident light toward the corresponding PD 104.

The interconnection layer 108 has an interconnection 107 that transmits a pixel signal from the PD layer 106 to the signal processing chip 111. The interconnection 107 may have a multilayer structure, or may be provided with a passive element and an active element.

A plurality of the bumps 109 are disposed on a surface of the interconnection layer 108. The plurality of bumps 109 are aligned with a plurality of the bumps 109 that are provided on an opposing surface of the signal processing chip 111, and the imaging chip 113 and the signal processing chip 111 are for example pressed against each other so that the aligned bumps 109 are bonded and connected electrically with each other.

Similarly, a plurality of the bumps 109 are disposed on mutually opposing surfaces of the signal processing chip 111 and the memory chip 112. These bumps 109 are aligned with each other, and the signal processing chip 111 and the memory chip 112 are for example pressed against each other so that the aligned bumps 109 are bonded and connected electrically with each other.

Note that the bonding between the bumps 109 is not limited to Cu bump bonding by solid phase diffusion, but microbump joining by melting may be employed. Also, a single or a plurality of bumps 109 may be provided to for example a single output interconnection described below. The size of the bumps 109 may be larger than the pitch of the PDs 104. Also, a bump that is larger than the bump 109 corresponding to a pixel area in which pixels are arrayed may be provided as well in a peripheral area other than the pixel area.

The signal processing chip 111 receives an analog pixel signal output by the imaging chip 113. The signal processing chip 111 performs predetermined signal processing on the received pixel signal, and outputs the pixel signal to the memory chip 112. The signal processing chip 111 is an example of a signal processing unit. The memory chip 112 stores the signal received from the signal processing chip 111.

The signal processing chip 111 has a plurality of devices (or a plurality of signal processing circuits) that perform signal processing on a pixel signal output from a pixel. The signal processing chip 111 in the present example has a plurality of ADCs 180 as one example of the plurality of devices (or the plurality of signal processing circuits). The plurality of devices may be devices that are different from the ADCs 180, such as an arithmetic circuit. The respective ADCs 180 converts analog pixel signals output by the imaging chip 113 into digital signals. The signal processing chip 111 may perform predetermined computation such as correction on the digital signals.

At least a part of the plurality of ADCs 180 are arranged two-dimensionally on an ADC arrangement surface that is parallel with a surface on which a plurality of pixels are provided. For example, a plurality of pixels are arranged two-dimensionally in the row direction and the column direction in the imaging chip 113, and the plurality of ADCs 180 are arranged two-dimensionally in the row direction and the column direction in the signal processing chip 111. The plurality of ADCs 180 are preferably arranged at constant intervals in the signal processing chip 111.

Also, at least two or more ADCs 180 among the plurality of ADCs 180 arranged on the ADC arrangement surface are controlled in parallel, and operate in parallel. To operate in parallel means that analog-digital conversion processes in the plurality of ADCs 180 are performed substantially simultaneously. Thereby, the two or more ADCs 180 generate heat substantially simultaneously, and in comparison with a case where the plurality of ADCs 180 operate independently, fluctuation of a temperature distribution can be reduced. Note that all of the plurality of ADCs 180 that are arranged on the ADC arrangement surface preferably operate substantially simultaneously. Thereby, a temperature distribution that results from heat generation of the ADCs 180 can be made uniform. Also, the plurality of ADCs 180 may be arranged unevenly on the ADC arrangement surface of the signal processing chip 111. For example, the plurality of ADCs 180 may be arranged more densely on the edge portions than at the center of the ADC arrangement surface of the signal processing chip 111.

Also, the plurality of ADCs 180 may be arranged on a plurality of ADC arrangement surfaces that are positioned differently in the Z-axis direction in the signal processing chip 111. That is, the signal processing chip 111 may be a multilayer chip, and the plurality of ADCs 180 may be provided at different layers. In this case also, when positions where the plurality of ADCs 180 are arranged are projected onto a single ADC arrangement surface, the respective ADCs 180 are preferably arranged at constant intervals.

Also, the signal processing chip 111 has a TSV (through-silicon via) 110 that connects between circuits provided on front and back surfaces respectively. The TSV 110 is preferably provided in the peripheral area. Also, the TSV 110 may be provided also in the peripheral area of the imaging chip 113, and the memory chip 112.

Figure 2:
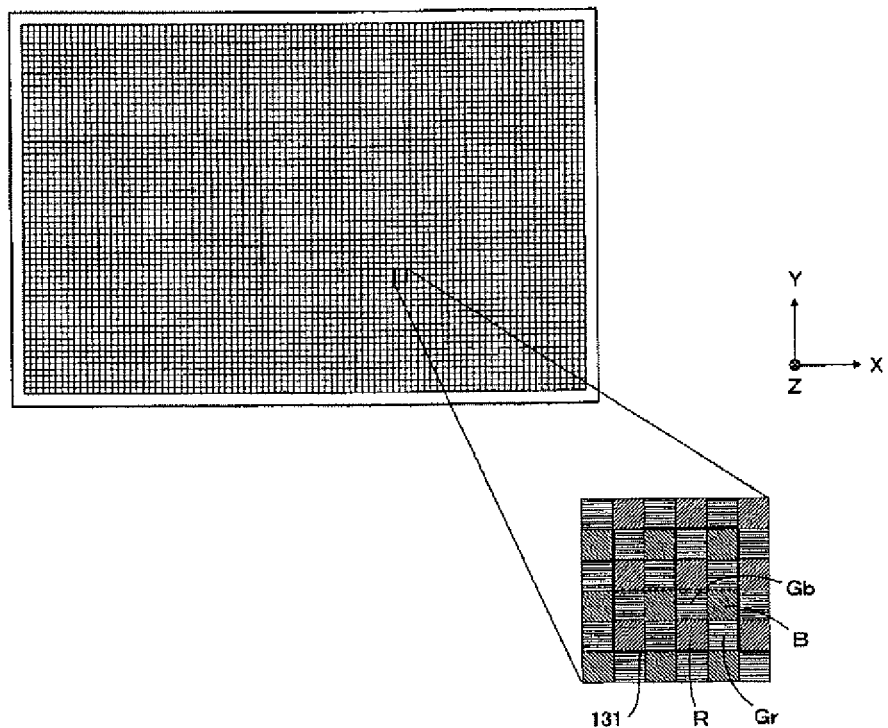
FIG. 2 is a diagram for explaining a pixel array of an imaging chip 113, and a unit group 131.

FIG. 2 is a diagram for explaining a pixel array of the imaging chip 113, and a unit group 131. In particular, FIG. 2 illustrates the appearance of the imaging chip 113 as observed from the backside. The unit group 131 is an example of an area that has a plurality of pixels. Also, the imaging chip 113 is an example of a pixel unit that has a plurality of areas that each include a plurality of pixels. Pixels are arrayed to form a matrix along the row direction and the column direction in the pixel area. In the present example, the x-axis direction is defined as the row direction, and the y-axis direction is defined as the column direction. In the present embodiment, adjacent four pixels×four pixels, 16 pixels, form one group. The grid lines in FIG. 2 represent the concept that adjacent pixels are grouped to form the unit group 131. Note that the unit group 131 is illustrated conceptually for explaining the positions of the ADCs 180 described below, and the imaging chip 113 may not operate independently in the unit of the unit group 131.

As illustrated in the partially enlarged view of the pixel area, the unit group 131 includes, within its upper left, upper right, lower left, and lower right portions, four so-called Bayer arrays each including the four pixels consisting of green pixels Gb, Gr, a blue pixel B, and a red pixel R. The green pixels Gb, Gr have green filters as the color filters 102, and receive light in the green wavelength band of incident light. Similarly, the blue pixel B has a blue filter as the color filter 102, and receives light in the blue wavelength band, and the red pixel R has a red filter as the color filter 102, and receives light in the red wavelength band.

Figure 3:
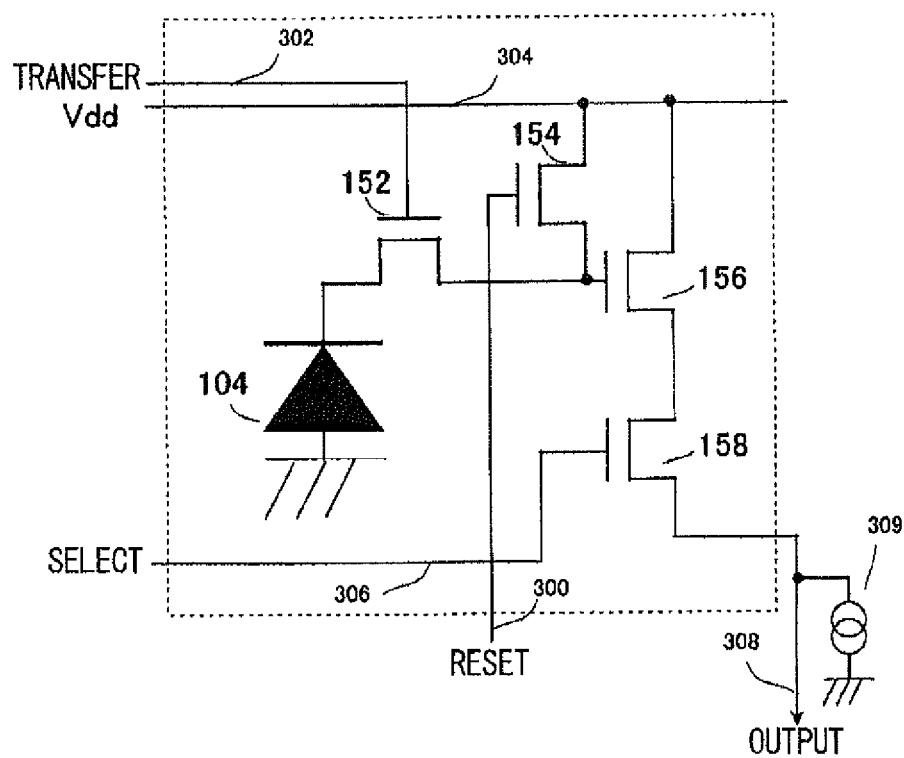
FIG. 3 is an equivalent circuit schematic of a pixel 150.

FIG. 3 is an equivalent circuit schematic of a pixel 150. Each of a plurality of the pixels 150 has the PD 104, a transfer transistor 152, a reset transistor 154, an amplifying transistor 156 and a selecting transistor 158. At least a part of these transistors corresponds to the transistor 105 in FIG. 1. Furthermore, a reset interconnection 300 to which an ON signal of the reset transistor 154 is supplied, a transfer interconnection 302 to which an ON signal of the transfer transistor 152 is supplied, a power supply interconnection 304 that receives power supply from a power supply Vdd, a selecting interconnection 306 to which an ON signal of the selecting transistor 158 is supplied, and an output interconnection 308 that outputs a pixel signal are disposed in the pixel 150. In the following, each transistor is explained as an n-channel type FET as an example, the type of the transistors is not limited thereto.

The source, gate, and drain of the transfer transistor 152 are connected one end of the PD 104, the transfer interconnection 302, and the gate of the amplifying transistor 156, respectively. Also, the drain and source of the reset transistor 154 are connected to the power supply interconnection 304, and the gate of the amplifying transistor 156, respectively. The drain and source of the amplifying transistor 156 are connected to the power supply interconnection 304 and the drain of the selecting transistor 158, respectively. The gate and source of the selecting transistor 158 are connected to the selecting interconnection 306, and the output interconnection 308, respectively. A load current source 309 supplies current to the output interconnection 308. That is, the output interconnection 308 for the selecting transistor 158 is formed by a source follower. Note that the load current source 309 may be provided on the side of the imaging chip 113 or on the side of the signal processing chip 111.

Figure 4:
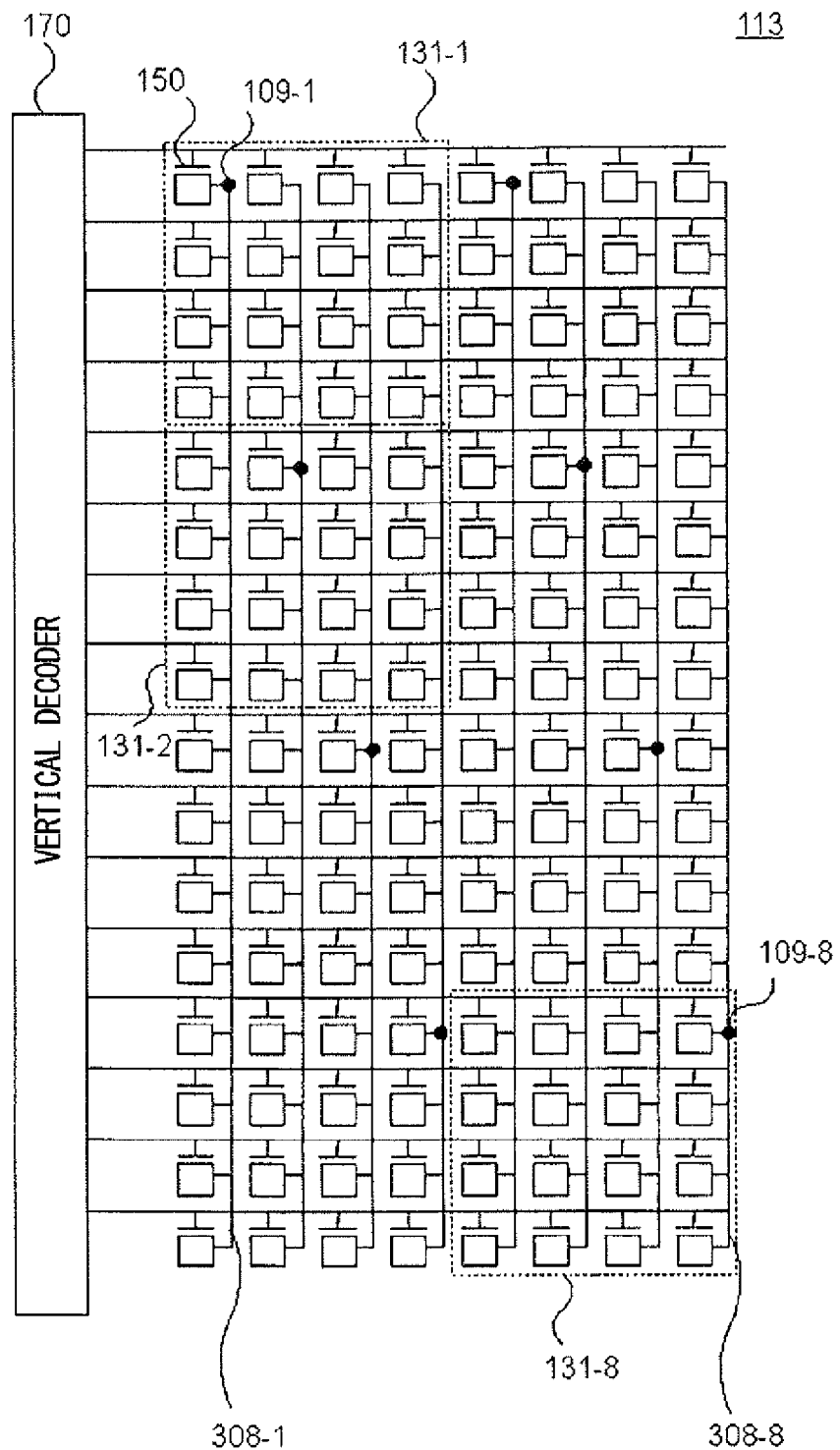
FIG. 4 is a diagram that illustrates an arrangement example of pluralities of pixels 150 and bumps 109 in the imaging chip 113.

FIG. 4 is a diagram that illustrates an arrangement example of the pluralities of pixels 150 and bumps 109 in the imaging chip 113. Note that the pixels 150 are the same with the pixel 150 illustrated in FIG. 3, but are simplified in FIG. 4. As illustrated in FIG. 4, the plurality of pixels 150 are arranged to form a matrix along the row direction and the column direction. Note that the row direction and the column direction refer to two different directions on a plane, and are not necessarily orthogonal to each other. Note that in the present example, the plurality of pixels 150 is explained by being divided conceptually into the unit group 131 including four pixels×four pixels. The plurality of pixels 150 in the present example is divided into eight unit groups including unit groups 131-1 to 131-8. Note that dotted lines indicating the unit groups 131-3 to 131-7 are omitted.

The pixels 150 provided along the respective columns are connected to the common output interconnections 308. Also, the imaging chip 113 has a vertical decoder 170 that reads out pixel signals from the plurality of pixels 150 on a row-by-row basis. The pixels 150 provided along the respective rows are connected to the common control interconnections, and pixel signal of the pixels 150 are read out according to control signals from the vertical decoder 170. Pixel signals that are read out from the respective pixels 150 in a selected row are transmitted in parallel via the corresponding output interconnections 308 and bumps 109, and are input to the corresponding ADCs 180 provided in the signal processing chip 111. The vertical decoder 170 is one example of a control unit that operates the two or more ADCs 180 in parallel.

Figure 5:
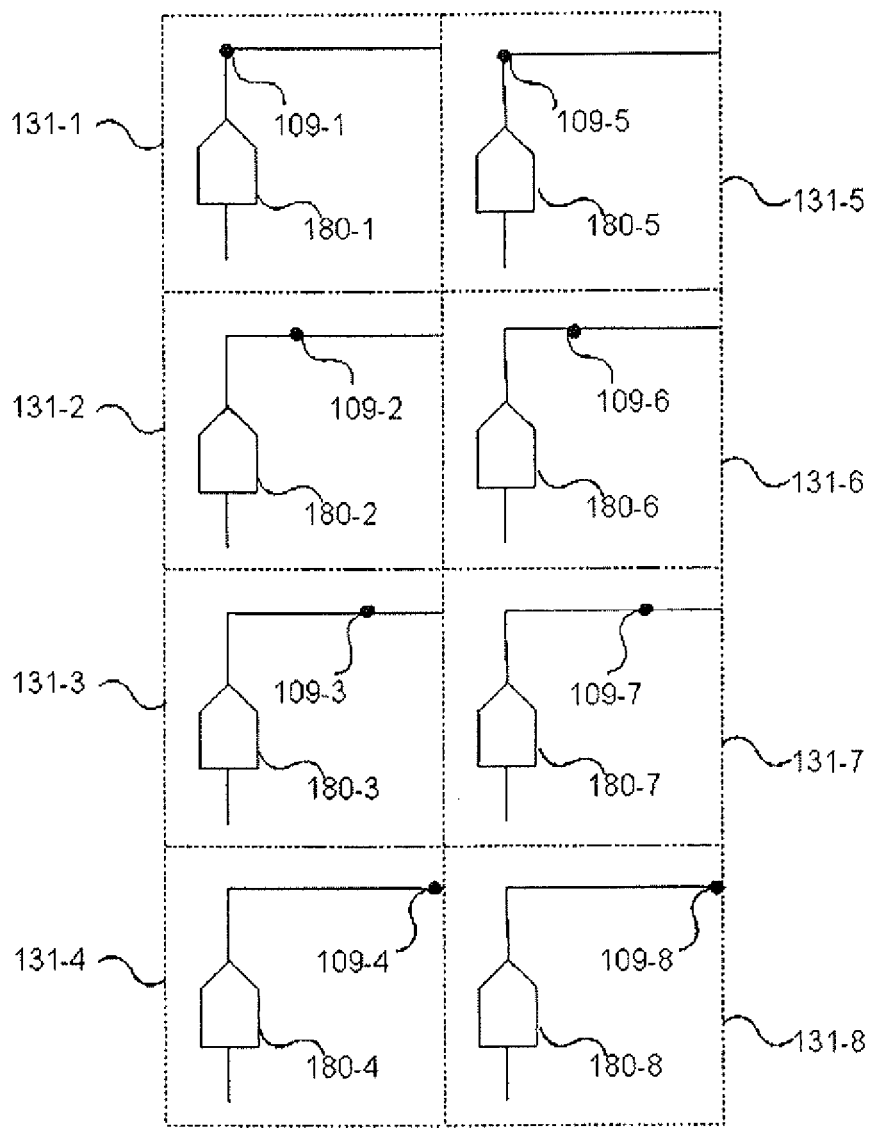
FIG. 5 is a diagram that illustrates a plurality of ADCs 180 that are arranged on an ADC arrangement surface of a signal processing chip 111.

FIG. 5 is a diagram that illustrates the plurality of ADCs 180 that are arranged on the ADC arrangement surface of the signal processing chip 111. Note that FIG. 5 illustrates an area onto which the plurality of unit groups 131 illustrated in FIG. 4 are projected. The respective ADCs 180 are each provided in any one or more pixel columns. That is, the respective ADCs 180 are each provided in any one or more output interconnections 308. The respective ADCs 180 are connected to the plurality of pixels 150 in a corresponding column via the corresponding output interconnection 308. The plurality of ADCs 180 in the present example are provided in a one-to-one correspondence with the plurality of output interconnections 308 in the pixel area. The respective ADCs 180 receive pixel signals of the pixels 150 in a row that is selected by the vertical decoder 170 among the pixels 150 that are connected to the corresponding output interconnection 308, and convert the pixel signals into digital signals. Note that, when the respective ADCs 180 are each connected to the plurality of output interconnections 308, a device to buffer pixel signals from the respective output interconnections 308, and sequentially input the pixel signals to the corresponding ADCs 180 may be further provided to the signal processing chip 111.

Also, the respective ADCs 180 are arranged two-dimensionally on the ADC arrangement surface of the signal processing chip 111. Here, to be arranged two-dimensionally means that the ADCs 180 are arranged along at least two directions, and the two directions do not have to be orthogonal to each other. The plurality of ADCs 180 in the present example are arranged at constant intervals in the row direction and the column direction that are orthogonal to each other. Also, a predetermined number of the ADCs 180 may be each provided to the respective unit groups 131. One of the plurality of ADCs 180 in the present example is provided to each of the unit groups 131.

Note that the length of the respective ADCs 180 in the column direction is shorter than the length of a column of the pixel area in which the plurality of pixels 150 is provided. Also, the respective ADCs 180 may have a substantially square shape on the ADC arrangement surface. When the respective ADCs 180 have such a shape, the flexibility of arranging the ADC 180 improves, and as illustrated in FIG. 5, the ADCs 180 can be easily arranged uniformly on the ADC arrangement surface.

Because according to the imaging sensor 100 in the present example, the respective ADCs 180 are connected to the output interconnections 308 of respective columns, the respective ADCs 180 operate substantially simultaneous every time the vertical decoder 170 selects a given row. In addition, because the respective ADCs 180 are arranged uniformly on the ADC arrangement surface of the signal processing chip 111, the temperature distribution can be made uniform on the ADC arrangement surface even when the respective ADCs 180 generate heat. For this reason, fluctuation and the like of dark current of the plurality of PDs 104 due to heat generation of the ADCs 180 can be reduced. Note that this effect becomes more noticeable when the number of the pixels 150 in the imaging chip 113 is larger. Also, the imaging sensor 100 is not limited to the one in which all the ADCs 180 on the ADC arrangement surface operate simultaneously. As long as the two or more ADCs 180 on the ADC arrangement surface operate simultaneously, the fluctuation of the temperature distribution can be reduced. For example, when the vertical decoder 170 selects a given row, pixel signals from all the pixels 150 in the row may not be read out simultaneously, but pixel signal from the pixels 150 in the row may be read out in the unit of a group each consisting of two or more pixels 150. In this case, pixel signals from two or more pixels 150 in a group are read out simultaneously, and the two or more corresponding ADCs 180 operate simultaneously.

Note that when the unit group 131 has n pixels×n pixels, the plurality of pixels 150 is divided into the n unit groups 131 in the column direction. That is, the plurality of pixels 150 preferably has, in the column direction, the unit groups 131 the number of which is the same with the number of columns in the unit group 131. Each ADC 180 provided in the unit groups 131 lined up in the column direction is connected to any of the output interconnections 308 that corresponds to these unit groups 131.

Also, the signal processing chip 111 can read out only pixel signals of a part of the unit groups 131. That is, the signal processing chip 111 may read out pixels signals from pixels in the unit of the unit group 131. The signal processing chip 111 may provide a readout unit that reads out a signal from a pixel, in the unit of the unit group 131. For example, when only pixel signals of the pixels 150 included in the unit group 131-1 are read out, first, pixel signals of the pixels 150 in the first row of the unit group 131-1 (the four pixels 150 in the present example) are read out. In this case, the corresponding four ADCs 180-1, 180-2, 180-3, 180-4 convert the pixel signal of the respective pixels 150 into digital signals simultaneously.

In other words, the first ADC 180-1 and the second ADC 180-2 that process pixel signals from a first pixel 150 and a second pixel 150, respectively, in the unit group 131-1 are stacked in the pixel area. Also, the first ADC 180-1 is arranged at a position under an area of the unit group 131-1 having the above-mentioned first pixel 150 and second pixel 150, and the second ADC 180-2 is arranged at a position not under the area of the unit group 131-1.

Next, pixel signals of the pixels 150 in a second row in the unit group 131-1 are read out. At this time also, the corresponding four ADCs 180-1 to 180-4 convert the pixel signals from the respective pixels 150 into digital signal simultaneously. Similarly, the four ADCs 180-1 to 180-4 are used simultaneously to read out the pixels 150 in a third row and a fourth row in the unit group 131-1 sequentially. After reading out from the pixels 150 in the last row in the unit group 131-1, the read-out target row returns to the first row, and the processing is repeated.

Because according to the present example, the plurality of ADCs 180 arranged at different locations are used, the temperature increase due to heat generation of the ADCs 180 can be made uniform within a surface even when pixel signals of only the local pixels 150 included in the unit group 131 are read out.

Also, the respective ADCs 180 are connected to the corresponding output interconnections 308 via the bumps 109. The imaging sensor 100 in the present example has a single bump 109 for each ADC 180. The respective bumps 109 are formed in areas of the same unit groups 131 with the respective ADCs 180. The respective bumps 109 may be provided immediately below the output interconnections 308 which are to be connected to the ADCs 180. For example, the bumps 109 are provided to the respective output interconnections 308, and are arranged such that the positions of the bumps 109 in the column direction are displaced by predetermined intervals for the respective output interconnections 308 that are adjacent in the row direction. The predetermined intervals may be equal to the length of the unit group 131 in the column direction. Also, the arrangement pattern of the bumps 109 may be repeated every n rows (note that n is the number of the pixels 150 included in the unit group 131 in the row direction).

Note that the respective ADCs 180 may be provided at the same relative positions in the areas of the respective unit groups 131. In this case, the relative positions of the ADC 180 and the bump 109 may be different among the unit groups 131. The signal processing chip 111 has an interconnection that connects the corresponding ADC 180 and bump 109.

Figure 6:
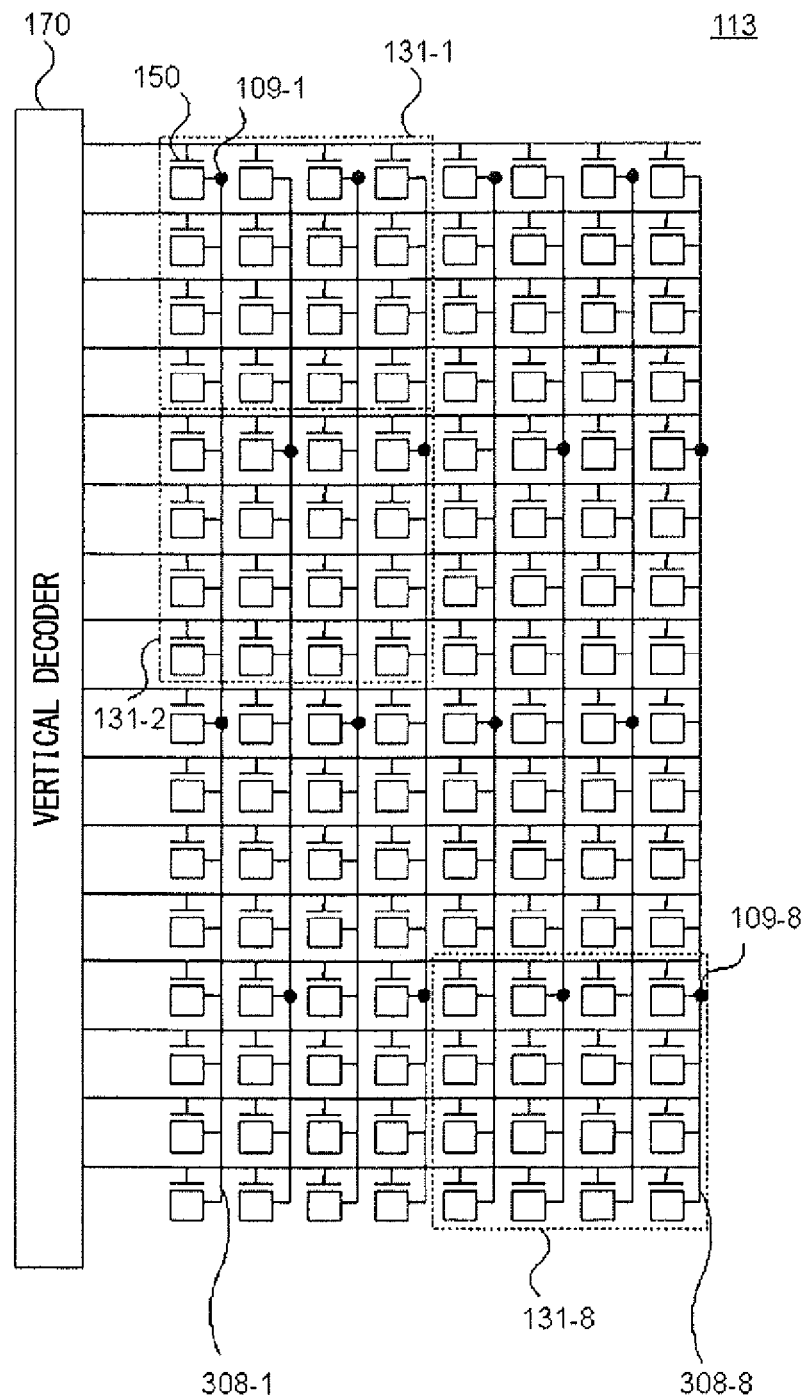
FIG. 6 is a diagram that illustrates another arrangement example of pluralities of pixels 150 and bumps 109 in the imaging chip 113.

FIG. 6 is a diagram that illustrates another arrangement example of the pluralities of pixels 150 and bumps 109 in the imaging chip 113. Although in the example illustrated in FIG. 4, a single bump 109 is provided to a single output interconnection 308, a plurality of bumps 109 is provided to a single output interconnection 308. In this case, a plurality of bumps 109 for a single output interconnection 308 may be provided in areas of the different unit groups 131. The plurality of bumps 109 connected to the single output interconnection 308 is connected to a common ADC 180. That is, even when a plurality of bumps 109 is provided to a single output interconnection 308, bumps 109 that are connected to the same output interconnection 308 are connected to the same ADC 180. In this case, the signal processing chip 111 has an interconnection that connects the plurality of bumps 109 connected to the same output interconnection 308 to the same ADC 180. The interconnection is formed across areas of a plurality of the unit groups 131. Also, a part of the plurality of bumps 109 provided to the output interconnection 308 may be a dummy bump that is not connected to the output interconnection 308 and the ADC 180.

The plurality of bumps 109 in the present example are also preferably arranged at constant intervals in the row direction and the column direction. The row direction and the column direction are examples of a first direction, and a second direction that crosses the first direction, and a plurality of pixels are arrayed in the first direction and the second direction. Also, as illustrated in FIG. 6, the plurality of bumps 109 in each column may be arranged such that the positions in the column direction are displaced by predetermined intervals for the respective output interconnections 308 that are adjacent in the row direction. As described above, by providing the plurality of bumps 109 to each output interconnection 308, the number of support points between the imaging chip 113 and the signal processing chip 111 can be increased, and a warp of the chip can be prevented.

Note that a method to control readout of pixel signals in the imaging sensor 100 can be the same as that for a so-called column-parallel sensor. For this reason, pixel signals can be read out by the ADC 180 provided to the signal processing chip 111 without using a complicated control line and the like. Also, the imaging sensor 100 can operate the plurality of ADCs 180 simultaneously even when the vertical decoder 170 reads out any row. Also, the signal processing chip 111 may have an analog CDS circuit or a DDS circuit (digital CDS circuit) that performs correlated double sampling on pixel signals, and removes noises.

Figure 7:
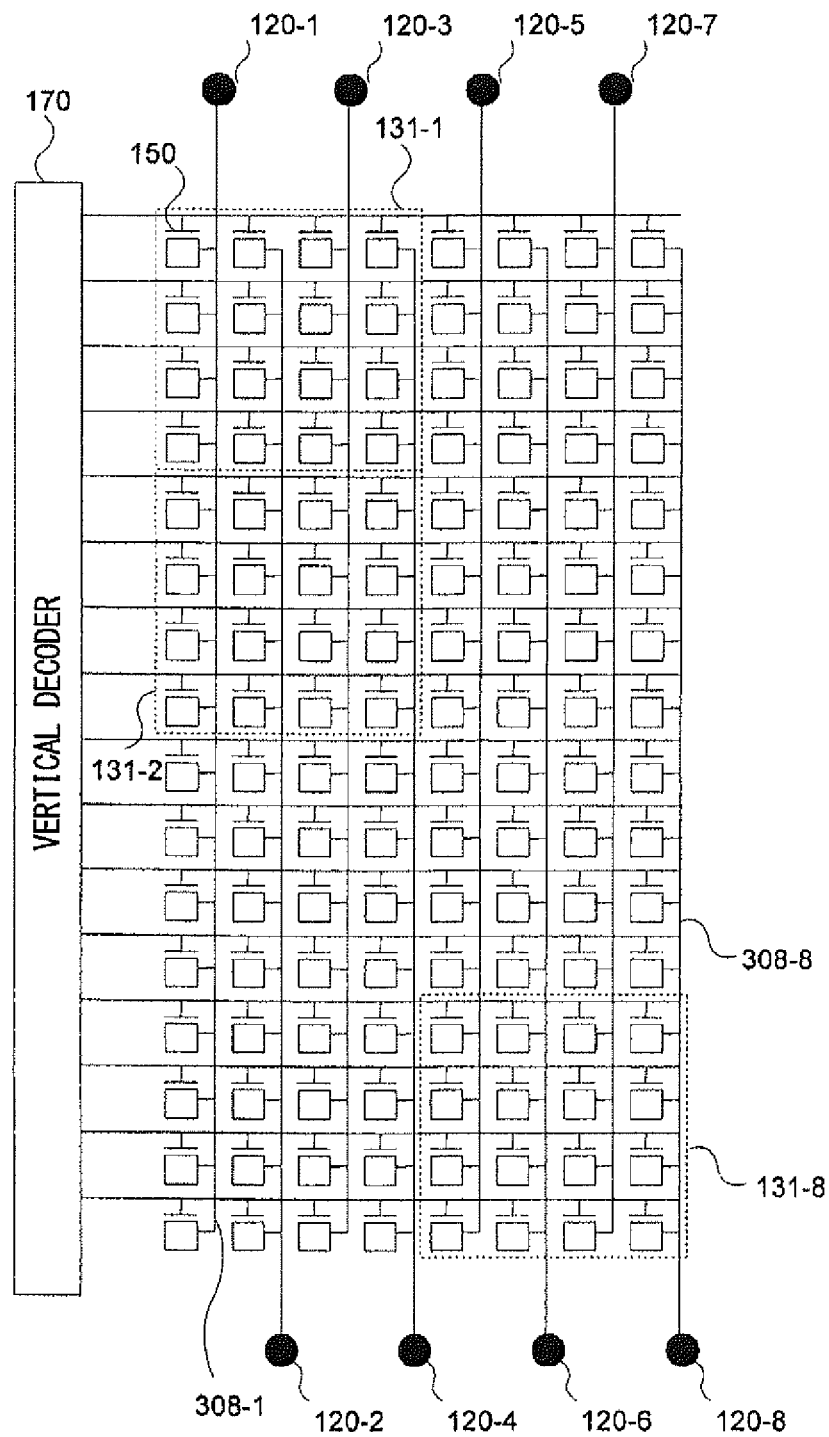
FIG. 7 is a diagram that illustrates an arrangement example of pluralities of pixels 150 and TSVs 120 in the imaging chip 113.

FIG. 7 is a diagram that illustrates an arrangement example of pluralities of pixels 150 and TSVs 120 in the imaging chip 113. In the present example, the imaging chip 113 and the signal processing chip 111 are electrically connected by the TSVs 120 in place of the bumps 109. The TSVs 120 are formed through the imaging chip 113 and the signal processing chip 111, and electrically connect the imaging chip 113 and the signal processing chip 111. The output interconnection 308 and the vertical decoder 170 are the same as those in the illustrated in FIG. 4.

The pixels 150 that are provided along the respective rows are connected to common control interconnections, and their pixel signals are read out according to control signals from the vertical decoder 170. The pixel signals that are read out from the respective pixels 150 in the selected row are transmitted in parallel via the respectively corresponding output interconnections 308 and TSVs 120, and input to the respectively corresponding ADCs 180 that are provided in the signal processing chip 111.

Note that the TSVs 120 are provided in the peripheral area other than the pixel area where pixels are arrayed. Although in the present example, the TSVs 120 are provided alternately on the upper side and the lower side of the pixel area every column, the array of the TSVs 120 is not limited to the present example. All the TSVs 120 may be provided on either of the upper side and the lower side of the pixel area, or may be provided alternately on the upper side and the lower side of the pixel area every two columns.

Figure 8:
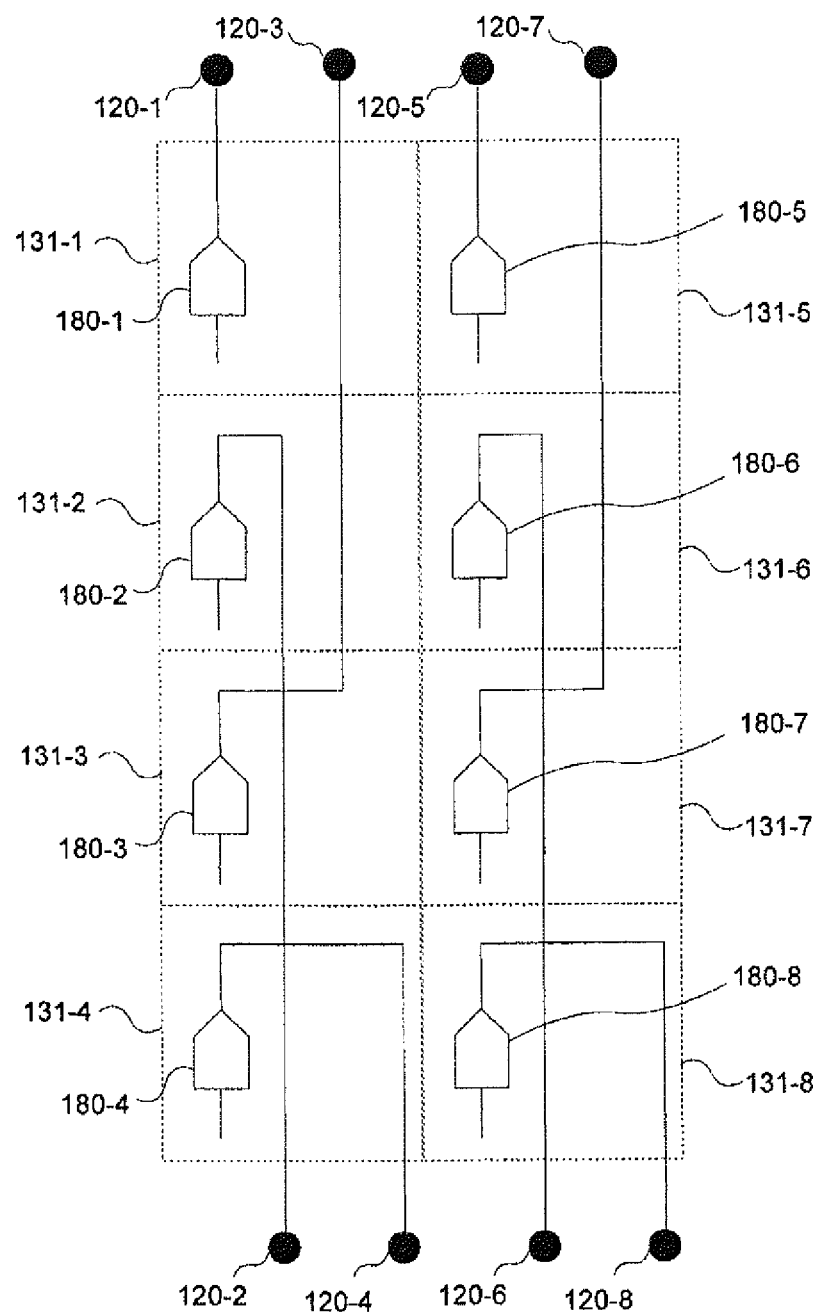
FIG. 8 is a diagram that illustrates the plurality of ADCs 180 and the TSVs 120 that are arranged on the ADC arrangement surface of the signal processing chip 111.

FIG. 8 is a diagram that illustrates the pluralities of ADCs 180 and TSVs 120 that are arranged on the ADC arrangement surface of the signal processing chip 111. The TSVs 120 that are indicated with the same reference numerals in FIG. 7 and FIG. 8 are electrically connected. For example, the respective TSVs 120 are formed continuously from the imaging chip 113 to the signal processing chip 111.

The arrangement of the ADCs 180 is the same with that illustrated in FIG. 5. The respective ADCs 180 are connected to the corresponding output interconnections 308 via the TSVs 120. The imaging sensor 100 in the present example has a single TSV 120 for a respective ADC 180. The arrangement of the TSVs 120 is the same with that in the imaging chip 113 illustrated in FIG. 7. Note that although interconnections are formed to cross in FIG. 8, these interconnections are electrically insulated by a multilayer interconnection structure. As illustrated in FIG. 7 and FIG. 8, the plurality of ADCs 180 can be operated in parallel and the temperature increase can be made uniform even if the TSVs 120 are used in place of the bumps 109.

Figure 9:
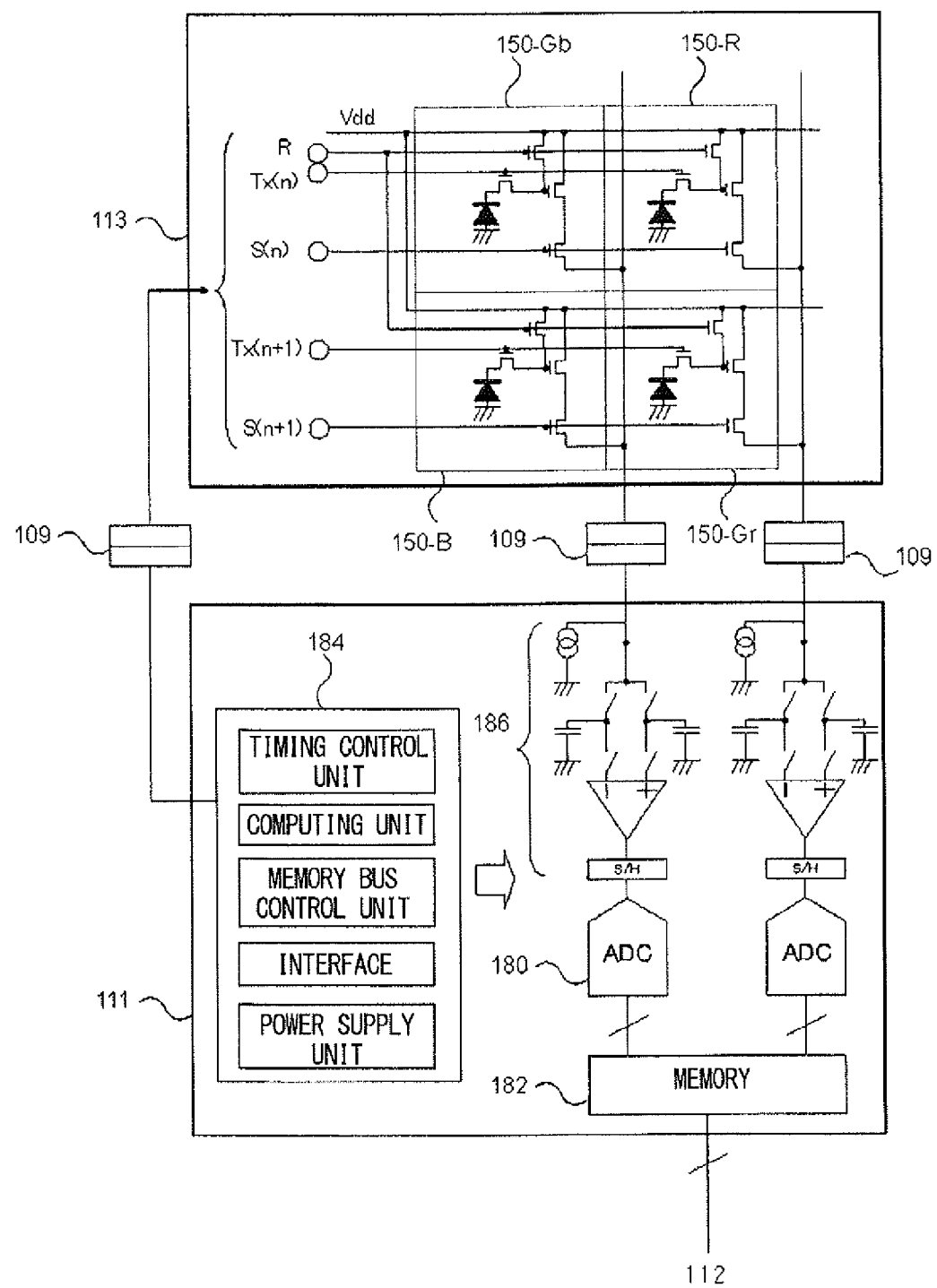
FIG. 9 is a diagram that illustrates the general idea of the signal processing chip 111 having an analog CDS circuit 186, together with the imaging chip 113.

FIG. 9 is a diagram that illustrates the general idea of the signal processing chip 111 having an analog CDS circuit 186, together with the imaging chip 113. Note that in FIG. 9, only two pixels×two pixels are illustrated as pixels in the imaging chip 113, and other pixels are omitted. Also, similarly in the signal processing chip 111, only two ADCs 180 are illustrated, and other ADCs 180 are omitted.

The signal processing chip 111 has the analog CDS circuits 186 for the respective ADCs 180. Operation of the analog CDS circuit 186 is described below. Also, the signal processing chip 111 has a control circuit 184. The control circuit 184 may function as the above-mentioned readout unit. The control circuit 184 includes a timing control unit, a computing unit, a memory bus control unit, an interface, a power supply unit, and the like. The control circuit 184 controls readout timing of each pixel 150 of the imaging chip 113 via the bump 109. The TSVs may be used in place of the bumps 109. Also, the control circuit 184 controls operation of the analog CDS circuit 186, the ADC 180, and a memory 182. The control circuit 184 transmits and receives a signal to/from the outside of the imaging sensor 100, and supplies electrical power from a power supply and an operation clock to each circuit of the signal processing chip 111. Also, the control circuit 184 performs predetermined computation on a pixel signal and a digital signal.

Figure 10:
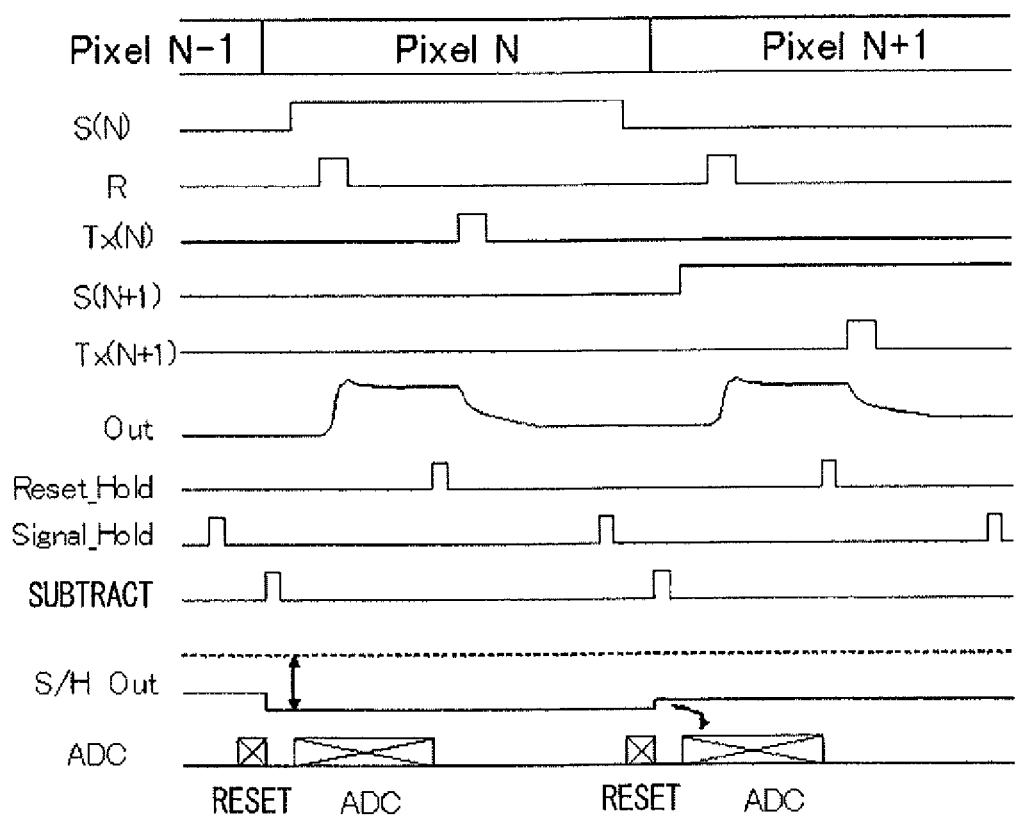
FIG. 10 is a timing chart that illustrates an operation example of the signal processing chip 111 having the analog CDS circuit 186.

FIG. 10 is a timing chart that illustrates an operation example of the signal processing chip 111 having the analog CDS circuit 186. The control circuit 184 sets a selection signal S (N) for a pixel 150-N to an H level, and also supplies a reset pulse R to the pixel 150-N. Thereby, an output Out of the pixel 150-N becomes a reset level. The control circuit 184 outputs a signal Reset_Hold to control switching of the analog CDS circuit 186, and charges a capacitor of the analog CDS circuit 186 at the reset level.

Next, the control circuit 184 supplies a transfer pulse Tx (N) to the pixel 150-N. Thereby, the pixel 150-N outputs a pixel signal. Then, the control circuit 184 outputs a signal Signal_Hold to control switching of the analog CDS circuit 186, and charges another capacitor of the analog CDS circuit 186 at a level of the pixel signal. Next, the control circuit 184 controls switching of the analog CDS circuit 186, and makes a subtracting circuit output the difference between voltages of the two capacitors. A sample hold circuit of the analog CDS circuit 186 retains a voltage value of the differential voltage output by the subtracting circuit, and inputs the voltage value to the ADC 180. The ADC 180 converts the differential voltage into a digital value. Such operation is performed on each pixel 150. Note that the operation is the same with conventional column-parallel sensors. In other words, because the imaging sensor 100 uses signal readout control in conventional column-parallel sensors as it is, and the plurality of ADCs 180 that are arranged in the signal processing chip 111 operate simultaneously, local heat generation in a chip can be prevented.

Figure 11:
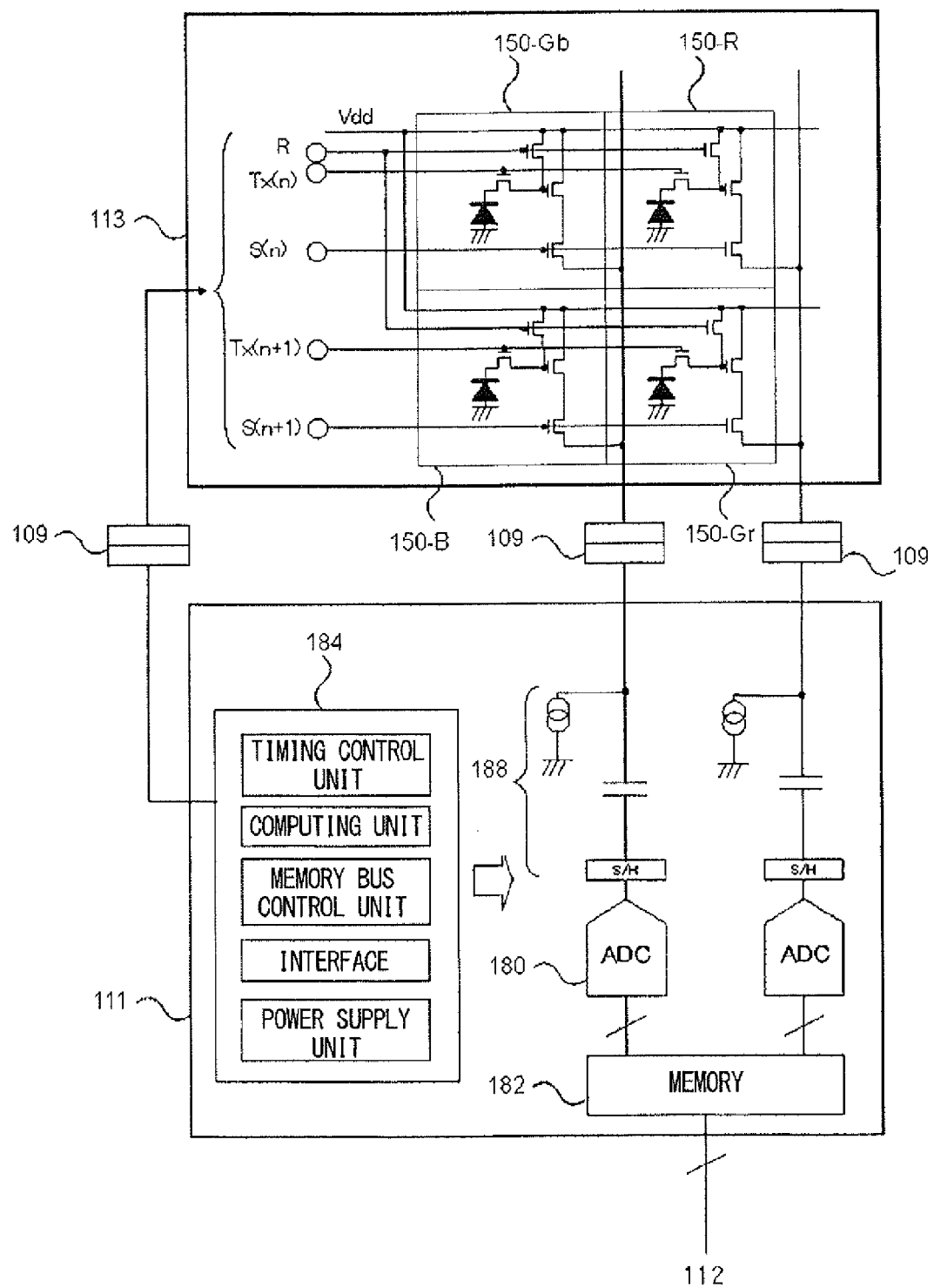
FIG. 11 is a diagram that illustrates the general idea of the signal processing chip 111 having a DDS circuit 188, together with the imaging chip 113.

FIG. 11 is a diagram that illustrates the general idea of the signal processing chip 111 having a DDS circuit 188, together with the imaging chip 113. The signal processing chip 111 in the present example has the DDS circuit 188 in place of the analog CDS circuit 186, in contrast to the signal processing chip 111 illustrated in FIG. 9.

Figure 12:
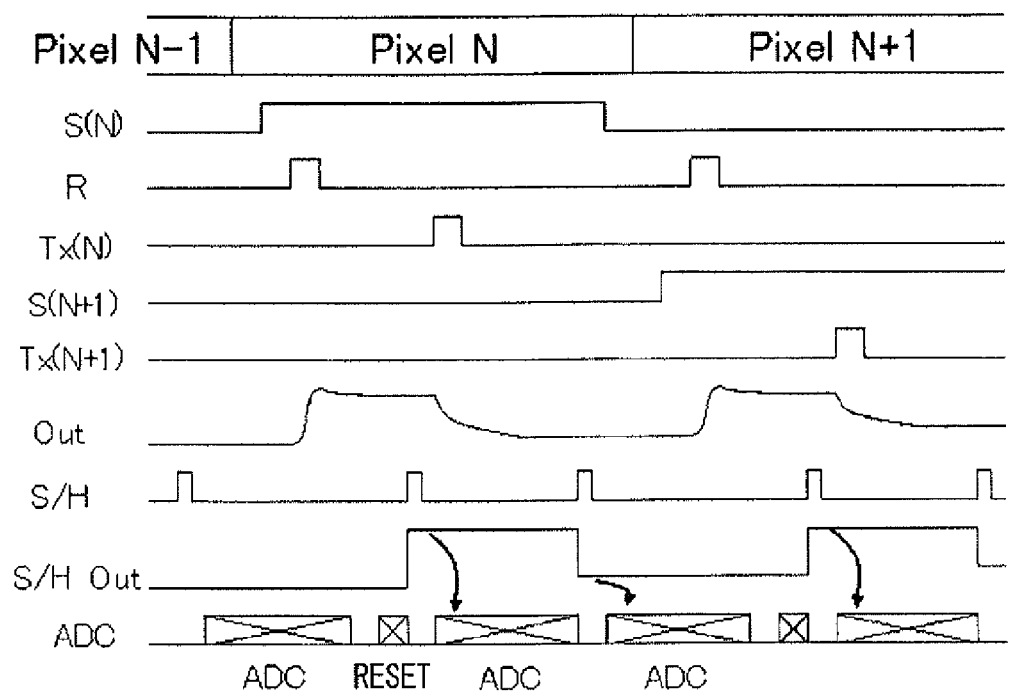
FIG. 12 is a timing chart that illustrates an operation example of the signal processing chip 111 having the DDS circuit 188.

FIG. 12 is a timing chart that illustrates an operation example of the signal processing chip 111 having the DDS circuit 188. The control circuit 184 sets a selection signal S (N) for the pixel 150-N to an H level, and also supplies a reset pulse R to the pixel 150-N. Thereby, an output Out of the pixel 150-N becomes a reset level. The control circuit 184 outputs a pulse S/H that makes a sample hold circuit of the DDS circuit 188 retain the reset level. The sample hold circuit inputs the reset level to the ADC 180. The ADC 180 converts the reset level into a digital value.

Next, the control circuit 184 supplies a transfer pulse Tx (N) to the pixel 150-N. Thereby, the pixel 150-N outputs a pixel signal. Then, the control circuit 184 outputs a pulse S/H that makes the sample hold circuit of the DDS circuit 188 retain a level of the pixel signal. The sample hold circuit inputs the level of the pixel signal to the ADC 180. The ADC 180 converts the level of the pixel signal into a digital value. The control circuit 184 calculates the difference between the digital value of the reset level output by the ADC 180 and the digital value of the level of the pixel signal. Such operation is performed on each pixel 150. Note that the operation is the same with conventional column-parallel sensors. In other words, because the imaging sensor 100 uses signal readout control in conventional column-parallel sensors as it is, and the plurality of ADCs 180 that are arranged in the signal processing chip 111 operate simultaneously, local heat generation in a chip can be prevented.

Figure 13:
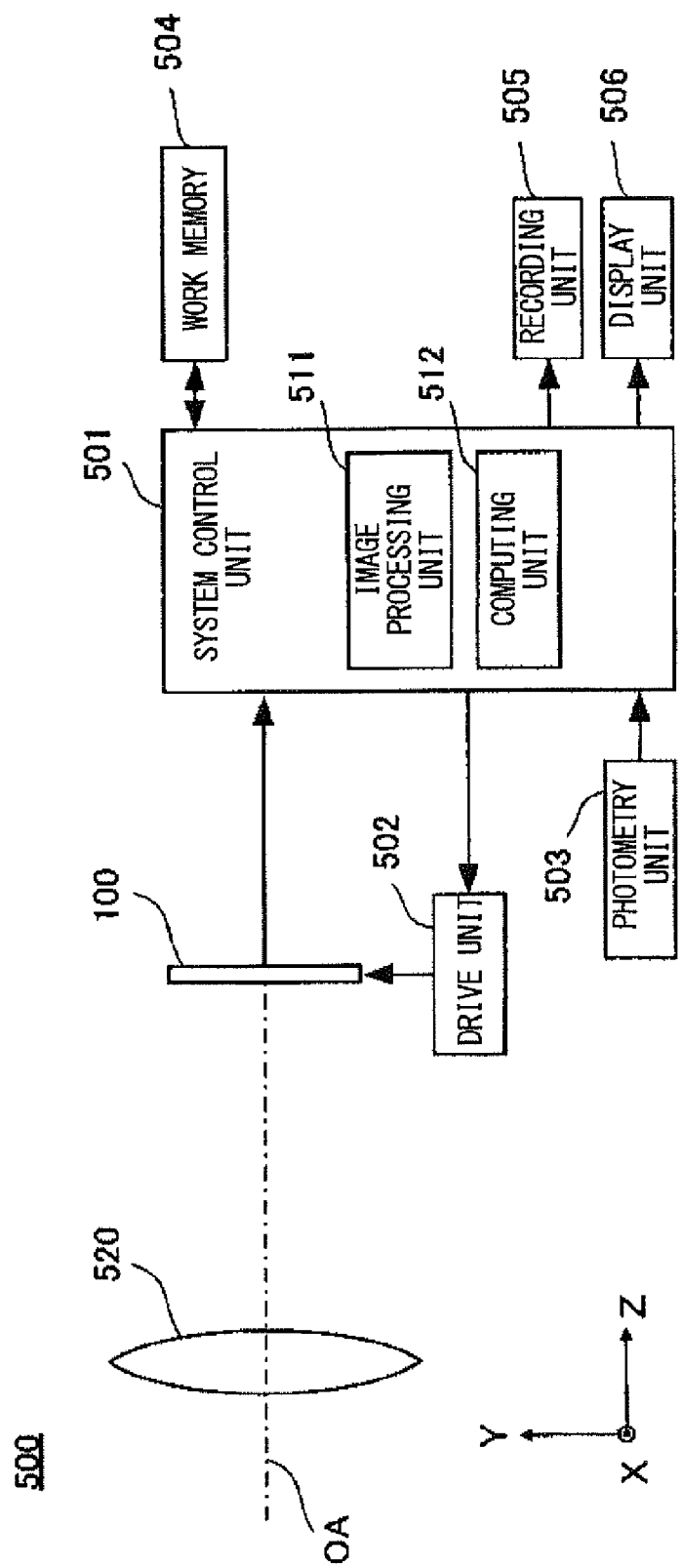
FIG. 13 is a block diagram that illustrates the configuration of an imaging device 500 according to the present embodiment.

FIG. 13 is a block diagram that illustrates the configuration of an imaging device 500 according to the present embodiment. An imaging device 500 includes an imaging lens 520 as an imaging optical system, and the imaging lens 520 guides a subject luminous flux that is incident along an optical axis OA to the imaging sensor 100. The imaging lens 520 may be a replaceable lens that can be attached/detached to and from the imaging device 500. The imaging device 500 includes, mainly, the imaging sensor 100, a system control unit 501, a drive unit 502, a photometry unit 503, a work memory 504, a recording unit 505, and a display unit 506.

The imaging lens 520 is configured with a plurality of optical lens groups, and forms an image of a subject luminous flux from a scene near its focal plane. Note that, in FIG. 13, the imaging lens 520 is representatively shown with a single hypothetical lens that is placed near the pupil. The drive unit 502 is a control circuit that executes electrical charge accumulation control such as timing control and area control on the imaging sensor 100 according to instructions from the system control unit 501. In this sense, it can be said that the drive unit 502 serves functions of an imaging sensor control unit that makes the imaging sensor 100 execute electrical charge accumulation and output pixel signals. The drive unit 502 is combined with the imaging sensor 100 to form an imaging unit. The control circuit to form the drive unit 502 may be formed as a chip, and stacked with the imaging sensor 100.

The imaging sensor 100 passes pixel signals over to an image processing unit 511 of the system control unit 501. The imaging sensor 100 is the same with the imaging sensor 100 that is explained with reference to FIG. 1 to FIG. 12. The image processing unit 511 performs various types of image processing by using the work memory 504 as a workspace, and generates image data. For example, when a JPEG file format image data is generated, white balance processing, gamma processing, and the like are performed, and then compression processing is executed. The generated image data is recorded in the recording unit 505 and converted into display signals, and is displayed on the display unit 506 for a preset period of time.

The photometry unit 503 detects luminance distribution of a scene prior to an imaging sequence for generating image data. The photometry unit 503 includes an AE sensor of approximately one million pixels, for example. A computing unit 512 of the system control unit 501 calculates luminance of respective areas within a scene, upon receiving an output of the photometry unit 503. The computing unit 512 decides a shutter speed, a diaphragm value, and an ISO speed according to the calculated luminance distribution. Note that pixels used in the AE sensor may be provided in the imaging sensor 100, and in this case, the photometry unit 503 separate from the imaging sensor 100 may not be provided. Because according to the imaging device 500 in the present example, the imaging sensor 100 in which local heat generation by the ADC 180 is reduced is used, image data in which fluctuation of dark current and the like is reduced can be acquired.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An imaging sensor comprising:
   an imaging chip having
      a pixel unit that has first and second pixel regions that each includes a plurality of pixels,
      a readout unit that is provided for each of the first and second pixel regions, and each readout unit reading out signals from pixels of each of the first and second pixel regions, and
      a signal line that is provided for each of the first and second pixel regions; and
   a signal processing chip above which the imaging chip is stacked, the signal processing chip having
      a signal processing unit that is stacked with the pixel unit and has (i) a first signal processing circuit that performs signal processing on a signal from a first pixel of the first pixel region that is read out by the readout unit for the first pixel region and output to the first signal processing circuit via the signal line for the first pixel region, and (ii) a second signal processing circuit that performs signal processing on a signal from a second pixel of the second pixel region that is read out by the readout unit for the second pixel region and output to the second signal processing circuit via the signal line for the second pixel region,
   both the first pixel region and the second pixel region being stacked above both the first signal processing circuit and the second signal processing circuit such that both the first pixel region and the second pixel region overlap both the first signal processing circuit and the second signal processing circuit as viewed along a direction parallel to an optical axis of the imaging sensor, and the first pixel region being connected to only the first signal processing circuit, and the second pixel region being connected to only the second signal processing circuit.

2. The imaging sensor according to claim 1, wherein the first signal processing circuit includes a first A/D converter that converts a pixel signal from the first pixel into a digital signal, and the second signal processing circuit includes a second A/D converter that converts a pixel signal from the second pixel into a digital signal.

3. The imaging sensor according to claim 1, wherein the pixel unit and the signal processing unit are connected via a plurality of bumps, and the bumps are arranged in the first and second pixel regions respectively.

4. The imaging sensor according to claim 1, wherein the pixel unit and the signal processing unit are connected via a plurality of bumps, and the plurality of bumps are arranged at constant intervals.

5. An imaging sensor comprising:

an imaging chip having
  a pixel unit that has first and second pixel regions that each includes a plurality of pixels,
  a readout unit that is provided for each of the first and second pixel regions, each readout unit reading out signals from pixels of each of the first and second pixel regions, and
  a signal line that is provided for each of the first and second pixel regions; and a signal processing chip above which the imaging chip is stacked, the signal processing chip having
  a signal processing unit that is stacked with the pixel unit and has (i) a first signal processing circuit that performs signal processing on a signal from a first pixel of the first pixel region and a signal from a second pixel of the first pixel region, that are read out by the readout unit for the first pixel region and output to the first signal processing circuit via the signal line for the first pixel region, and (ii) a second signal processing circuit that performs signal processing on a signal from a third pixel of the second pixel region and a signal from a fourth pixel of the second pixel region, that are read out by the readout unit for the second pixel region and output to the second signal processing circuit via the signal line for the second pixel region, both the first pixel region and the second pixel region being stacked above both the first signal processing circuit and the second signal processing circuit such that both the first pixel region and the second pixel region overlap both the first signal processing circuit and the second signal processing circuit as viewed along a direction parallel to an optical axis of the imaging sensor, and the first pixel region being connected to only the first signal processing circuit, and the second pixel region being connected to only the second signal processing circuit.

6. The imaging sensor according to claim 5, wherein the first signal processing circuit includes a first A/D converter that converts the signal from the first pixel and the signal from the second pixel into a digital signal, and the second signal processing circuit includes a second A/D converter that converts the signal from the third pixel and the signal from the fourth pixel into a digital signal.

7. The imaging sensor according to claim 5, wherein the pixel unit and the signal processing unit are connected via a plurality of bumps, and each bump is arranged in a respective one of the first and second pixel regions.

8. The imaging sensor according to claim 5, wherein the pixel unit and the signal processing unit are connected via a plurality of bumps arranged at constant intervals.

9. The imaging sensor according to claim 1, wherein the first pixel region is arranged as a first column of pixels, and the second pixel region is arranged as a second column of pixels.

10. The imaging sensor according to claim 5, wherein the first pixel region is arranged as a first column of pixels, and the second pixel region is arranged as a second column of pixels.

* * * * *